United States Patent [19]

Toyokura et al.

[11] 4,270,136
[45] May 26, 1981

[54] MIS DEVICE HAVING A METAL AND INSULATING LAYER CONTAINING AT LEAST ONE CATION-TRAPPING ELEMENT

[75] Inventors: Nobuo Toyokura, Kawasaki; Hiroshi Tokunaga, Yokohama; Shinichi Inoue, Kawasaki; Hajime Ishikawa, Yokohama; Masaichi Shinoda, Sagamihara, all of Japan

[73] Assignee: Fujitsu Limited, Tokyo, Japan

[21] Appl. No.: 23,460

[22] Filed: Mar. 23, 1979

[30] Foreign Application Priority Data

Mar. 25, 1978 [JP] Japan ................... 53/34529
Jun. 7, 1978 [JP] Japan ................... 53/68513

[51] Int. Cl.³ .................. H01L 29/78; H01L 29/34; H01L 23/48
[52] U.S. Cl. ........................ 357/23; 357/52; 357/67; 357/65; 357/68
[58] Field of Search .............. 357/23, 52, 65, 67, 357/68

[56] References Cited

U.S. PATENT DOCUMENTS

| 3,402,081 | 9/1968 | Lehman | 357/52 |
| 3,617,824 | 11/1971 | Shinoda | 357/67 |
| 3,717,798 | 2/1973 | Kahn | 357/67 |
| 3,987,480 | 10/1976 | Diguet et al. | 357/67 |
| 4,015,175 | 3/1977 | Kendall et al. | 361/305 |
| 4,109,372 | 8/1978 | Geffken | 357/67 |

Primary Examiner—Andrew J. James
Attorney, Agent, or Firm—Staas & Halsey

[57] ABSTRACT

A metal layer of a metal-insulator-semiconductor type semiconductor device, e.g., a metal electrode on an oxide layer covering a semiconductor substrate of an MOS diode or an MOS FET, contains at least one cation-trapping element. The semiconductor substrate with the metal layer and the oxide layer is heated at an elevated temperature to diffuse some of the ions responsible for the cation-trapping element out of the metal layer and into the upper part of the oxide layer. The metal and oxide layers promote the surface passivation of the semiconductor device.

6 Claims, 7 Drawing Figures

MIS DEVICE HAVING A METAL AND INSULATING LAYER CONTAINING AT LEAST ONE CATION-TRAPPING ELEMENT

BACKGROUND OF THE INVENTION

1. Field of the Invention

The present invention relates to surface passivation of semiconductor devices and, more particularly, to metal-insulator-semiconductor type semiconductor devices and a method for production thereof, the metal layers of such devices protecting the semiconductor device from contamination and stabilizing the properties of the semiconductor devices.

2. Description of the Prior Art

Recently, there has been a demand that semiconductor devices, for example, transistors and integrated circuit devices, be miniaturized and integrated and that the stability and reliability of the semiconductor devices be improved, simultaneously.

It is known by persons having ordinary skill in the art that semiconductor circuit elements of semiconductor devices are contaminated by cations of alkali ions, especially, sodium ions ($Na^+$), so that the stability of the semiconductor devices is poor. Accordingly, in order to decrease the effect of such contamination, it has been suggested to remove or to trap the contaminant in the steps of thermal-oxidizing a semiconductor substrate and of forming an electrode.

Namely, when the semiconductor substrate is oxidized, chlorine gas ($Cl_2$) is introduced into an oxidizing atmosphere (cf. Kriegler, R. J., Cheng, Y. C. and Colton, D. R., "The Effect of HCl and $Cl_2$ on the Thermal Oxidation of Silicon," Jour. of Electrochem. Soc., vol. 119, pp. 388–392, 1972). Thus, chlorine is contained in an oxide layer formed on the surface of the semiconductor substrate. The chlorine existing in such oxide layer electrically neutralizes the contaminant, especially sodium ions ($Na^+$), entering the oxide layer. Furthermore, coating layers, such as an insulating layer lying under a conductive metal layer and on a surface of a semiconductor substrate, an insulating layer lying between conductive metal layers and a surface protecting layer covering the conductive metal layers, are made of phosphosilicate glass (PSG) or silicon nitride ($Si_3N_4$) (cf. Schnable, G. L., Kern, W. and Comizzoli, R. B., "Passivation Coatings on Silicon Devices," Jour. of Electrochem. Soc., vol. 122, pp. 1092–1103, 1975). Such coating layers stop the contaminant, such as sodium ions ($Na^+$), from passing through the coating layers. Especially, it is possible to trap sodium ions ($Na^+$) existing in the oxide layer formed on the semiconductor substate by forming the phosphosilicate glass layer on the oxide layer.

However, the above-mentioned anticontamination treatments, i.e. so-called passivation treatments, are complex and are not always sufficiently effective. Although such passivation treatments are carried out, there is a definite danger that the semiconductor device will lose the stability of semiconductor circuit elements thereof due to adhesive contaminant and vapor on the surface of the semiconductor device. Such contaminant and vapor are contained in the atmosphere, and the semiconductor device is usually exposed to the atmosphere until the semiconductor device is gas-tightly enclosed in a package.

Accordingly, in order to decrease the above-mentioned danger, persons with ordinary skill in the art can resort to one of the following three methods, taking the above-mentioned passivation treatments into consideration.

According to one of the methods, during the thermal oxidation of the semiconductor substrate the quantity of chlorine gas introduced into the oxidizing atmosphere is increased to increase the chlorine contained in the formed oxide layer. However, this method has defects in that the surface of the semiconductor substrate is etched too strongly and becomes rough and the surface state density is increased at the oxide layer-semiconductor substrate interface.

According to another one of the methods, the phosphorus concentration in the phosphosilicate glass, i.e. in the surface protecting layer and/or the insulating layer lying between the conductive metal layers, is increased. However, this method has defects in that the hygroscopic property of the phosphosilicate glass increases and an ionic polarization in the glass is easily generated.

According to another one of the methods, the surface protecting layer or the insulating layer lying between the conductive metal layers is made of a multilayer which is comprised of two or more layers, for example, a phosphosilicate glass or silicon nitride-silicon dioxide double layer. However, this method has a defect in that, since the thickness of the protecting and/or insulating layers is substantially increased, such layers cannot be used in a large-scale integrated circuit semiconductor device which requires a minute circuit design. Especially, in a semiconductor device including a metal-insulator-semiconductor (MIS) type of a semiconductor circuit element, a certain thickness in the range of, e.g., from 100 Å to 500 Å, of the insulating layer is required, but it is very difficult to make such an insulating layer out of the above-mentioned multilayer.

SUMMARY OF THE INVENTION

It is an object of the present invention to provide a semiconductor device without the above-mentioned defects.

It is a further object of the invention to provide a metal-insulator-semiconductor type semiconductor device having good stability and reliability.

It is a further object of the invention to provide a good surface passivation layer of a semiconductor device.

It is a further object of the invention to provide a method for producing a metal-insulator-semiconductor type semiconductor device having good stability and reliability.

According to the present invention, a metal-insulator-semiconductor type semiconductor device comprises (a) a semiconductor substrate, (b) an insulating layer covering a surface of the semiconductor substrate and (c) a metal layer, which is made of at least one metal element selected from the group consisting of tungsten, molybdenum, titanium, tantalum, niobium, hafnium and iron, and which is formed on the insulating layer. The semiconductor device is characterized in that the metal layer contains at least one cation-trapping element selected from the group consisting of boron, germanium, phosphorus, lead, tin, chromium and antimony, and that the upper part of the insulating layer contains some of the cation-trapping element which is diffused out of the metal layer.

It is preferable that the density of the cation-trapping element be in the range of from $10^{15}$ to $10^{21}$ per cubic centimeter of the metal layer. The density of the cation-trapping element must correspond to at least that of the cations, especially, sodium ions (Na+), which are contained in a semiconductor device. Usually a semiconductor device has a cation density of at least $10^{15}$ per cubic centimeter, so that the lower limit of the density of the cation-trapping element is $10^{15}$ per cubic centimeter. In a case where the metal layer contains cation-trapping elements at a density of more than $10^{21}$ per cubic centimeter, the resistance of the metal layer becomes high and the threshold voltage of the semiconductor device is shifted. Accordingly, the upper limit of the density is $10^{21}$ per cubic centimeter.

It is also preferable that the upper part of the insulating layer have a thickness of 60 Å or less from the metal layer-insulating layer interface.

The metal layer of the semiconductor device according to the invention is applicable to an MOS (metal oxide semiconductor) diode and a MOS FET (field effect transistor) as an electrode.

According to the invention, a method for producing a metal-insulator-semiconductor type semiconductor device comprises the steps of: forming an insulating layer on a semiconductor substrate, and forming a metal layer on the insulating layer, the metal layer being made of at least one metal element selected from the group consisting of tungsten, molybdenum, titanium, tantalum, niobium, hafnium and iron. The method is characterized in that during the formation step of the metal layer at least one cation-trapping element selected from the group consisting of boron, germanium, phosphorus, lead, tin, chromium and antimony is contained in the metal layer, and after the formation step of the metal layer is completed, the semiconductor substrate is heated to diffuse some of the cation-trapping element out of the metal layer and into the upper part of the insulating layer. It is preferable to carry out the heating treatment at a temperature in the range of from 700° C. to 1100° C. The formation of the metal layer is performed by a sputtering, chemical vapor deposition or vacuum evaporation method, preferably, the sputtering method.

DESCRIPTION OF THE PREFERRED EMBODIMENTS

Figure 1:
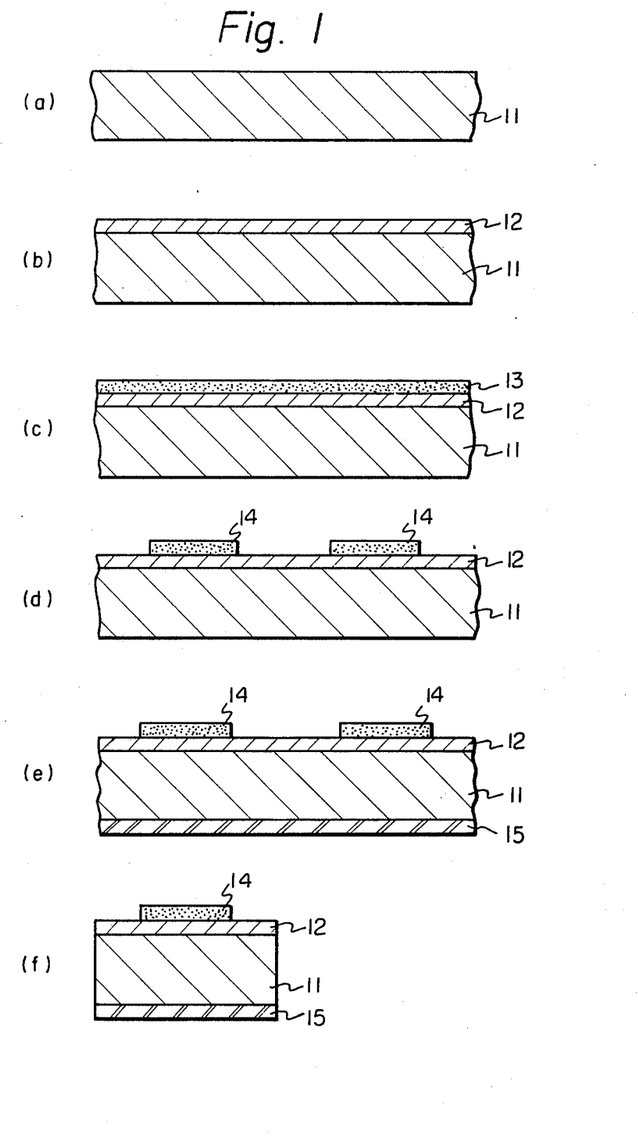
FIGS. 1(a) through 1(f) are schematic, cross-sectional views of an MOS diode in various stages of production.

Referring to FIG. 1(f), there is illustrated an MOS diode. As is known in the art an MOS diode is produced in the following manner. A semiconductor substrate 11 is oxidized to form an oxide layer 12 (cf. FIG. 1(b)). A thin metal layer 13 is formed on the oxide layer 12 and then, is selectively etched to leave parts of the metal layer 13 as electrodes 14 (cf. FIGS. 1(c) and (d)). Then an ohmic-contacting metal layer 15 is formed on the back surface of the semiconductor substrate 11 (cf. FIG. 1(d)). Finally, the semiconductor substrate 11 is divided into a large number of pieces (cf. FIG. 1(f)) by using a scribing method. The formation of the oxide layer 12, the metal layer 13 and the ohmic-contacting metal layer 15, the etching and the scribing are performed by any suitable process known in the art.

According to the present invention, when the metal layer 13 is formed, at least one cation-trapping element, selected from the group consisting of boron, germanium, phosphorus, lead, tin, chromium and antimony, preferably boron or phosphorus, is contained in the metal layer. Namely, in a case where the formation of the metal layer 13 is performed by, for example, a sputtering method, a target to be used for the sputtering treatment should be comprised of the metal of the metal layer and a cation-trapping element. However, instead of the cation-trapping element a nitride thereof may be used.

The density of the cation-trapping element contained in the metal layer can be controlled by changing the surface area of the element used as the target. By using a shutter arranged between the target and the oxide layer formed on the semiconductor substrate, only a part of the metal layer which is near the metal layer-oxide layer interface contains the cation-trapping element. Furthermore, it is preferable to arrange small pieces of the cation-trapping element at approximately equidistant intervals on the metal target. It is also possible to utilize a chemical vapor deposition (CVD) method or a vacuum evaporation method instead of the sputtering method.

According to the present invention, after the metal layer 13 is formed, the semiconductor substrate provided with the oxide layer 12 and the metal layer 13 is heated at a temperature in the range of from 700° C. to 1100° C., preferably from 800° to 1000° C., over a period of time in the range of from 5 to 30 minutes.

Mobile cations in an oxide layer of an MOS diode may vary the surface properties of a semiconductor substrate (for example, the cations may reach the interface of the oxide layer and the substrate to change the conductivity type of the surface of the semiconductor substrate from p-type to n-type). In a case where a metal layer is produced on the oxide layer by the method of the invention, the density of the mobile cations in the oxide layer becomes low. It is the inventors' judgment that the decrease of the mobile cation density in the oxide layer is caused by trapping the mobile cations, e.g. sodium ions (Na+), with the cation-trapping element, e.g. boron or phosphorus, which is moved to the metal layer-oxide layer interface and into the upper part of the oxide layer out of the metal layer by the heating treatment. Accordingly, it is possible to prevent an inconvenient variation of the flatband voltage (Vfb) of an MOS diode, which is generated by the contamination of the mobile ions.

The present invention can be utilized in MOS FET well known in the art. Namely, a metal layer of a metal-insulator-semiconductor type semiconductor device according to the invention is used in the MOS FET as a gate electrode which is formed on an oxide layer, i.e. a so-called gate oxide layer, covering a semiconductor substrate. According to the method of the invention, it is necessary to heat the semiconductor substrate with the formed oxide layer and metal layer, so that it is preferable to utilize a heating treatment for forming the source and drain regions. Namely, after the gate electrode of the metal layer is formed, doping ions are injected into the semiconductor substrate by an ion implantation method, and then, the substrate is heated for diffusing or activating the doping ions to form the source and drain regions. In addition, instead of the above-mentioned ion implantation and heating, it is possible to heat the semiconductor substrate at an elevated temperature in a flow of carrier gas containing doping ions.

The formation of the metal layer, according to the invention, in the MOS FET is performed in the same manner as that mentioned in the above-mentioned description of the embodiment of the MOS diode. The metal layer of an MOS FET produced by the method of the invention has the same effect as that mentioned in the description of the embodiment of the MOS diode.

The present invention will be understood more readily from the following examples.

EXAMPLE 1

An MOS (metal oxide semiconductor) diode according to the present invention comprised of a boron-containing tungsten layer 14, a silicon dioxide layer 12, a silicon substrate 11 and an ohmic-contacting metal layer 15, as illustrated in FIG. 1(f), was produced in the following manner.

Referring to FIG. 1(a), one piece of a p-type silicon semiconductor substrate 11, having a resistivity of 2 ohm-cm, was subjected to heating at 1000° C. under an oxygen atmosphere over a period of 65 minutes. A silicon dioxide ($SiO_2$) layer 12 having a thickness of 500 Å was formed on the semiconductor substrate 11, as seen in FIG. 1(b).

Subsequently, as seen in FIG. 1(c), a boron-containing tungsten layer 13 was deposited on the silicon dioxide layer 12 by a sputtering method. After being subjected to chemical analysis, the tungsten layer 13 was revealed to contain boron whose density was in the range of from $10^{19}$/cm$^3$ to $10^{20}$/cm$^3$ of the layer 13. The sputtering method was carried out as follows.

A tungsten target having a diameter of 4 inches was used for the sputtering treatment. According to a preferred sputtering method of the invention, eight pieces of a boron nitride cube, 5 mm in height, 5 mm in length and 5 mm in width, were placed in the proximity of the target periphery and were spaced almost equidistantly apart. The electrical source of the sputtering had a power of 250 W and a frequency of 13.56 MHz. The semiconductor substrate to be treated by the sputtering method was spaced from the target a distance of approximately 4 cm. The sputtering treatment was performed over a period of approximately 20 minutes, so that a 3500 Å thick, boron-containing tungsten layer was formed, as stated above.

Referring to FIG. 1(d), the boron-containing tungsten layer 13 was selectively etched by a conventional photo-etching technique, so as to leave parts of the layer 13 as electrodes 14 having a diameter of 500 microns.

The semiconductor substrate 11 provided with the electrodes 14 was then heated in a nitrogen ($N_2$) atmosphere containing 5% of hydrogen ($H_2$), at various temperatures in the range of from 700° C. to 1100° C., over a period of 15 minutes.

After the above-mentioned heating was completed, a silicon dioxide layer (not shown) was formed on the side of the semiconductor substrate 11 opposite from the side with the boron-containing tungsten electrode 14. The silicon dioxide layer was removed by using a conventional etching method and the ohmic-contacting metal electrode 15 was then formed on the exposed surface of the semiconductor substrate 11, as seen in FIG. 1(e), by using a conventional method, in this case, a vacuum evaporation method.

The semiconductor substrate 11 provided with the electrodes 14 and 15 was then divided by a scribing method into a large number of MOS diodes, as shown in FIG. 1(f). As a result the MOS diode according to the invention was produced.

In order to compare the MOS diode according to the present invention with an MOS diode provided with a tungsten electrode not containing boron according to the prior art, the latter MOS diode was produced in almost the same manner as that described above. Namely, when a sputtering treatment for forming a tungsten layer not containing boron was carried out as stated above, the above-mentioned boron nitride cubes were not used. This non-use of the boron nitride cubes was the only difference from the manner of production described above.

The produced MOS diodes according to the present invention and the prior art were subjected to measurement of the number of cations, which were movable in the silicon dioxide layer, by the following method. Namely, while the produced MOS diodes were heated at 250° C., a voltage was applied to the MOS diodes by connecting the boron-containing tungsten electrode or tungsten electrode not containing boron to the positive electrode of a power source and the ohmic-contacting metal electrode to the negative electrode of the power source. A current, which was generated by moving the cations in the silicon dioxide layer in the direction from the tungsten electrode containing boron or no boron to the semiconductor substrate, was measured, and then, the measured value was reduced to a mobile cation density value in the silicon dioxide layer. The results of the measurement are illustrated in FIG. 2, wherein the curves A and B indicate the mobile cation density of the MOS diodes provided with the boron-containing tungsten electrode and the tungsten electrode not containing boron, respectively.

Figure 2:
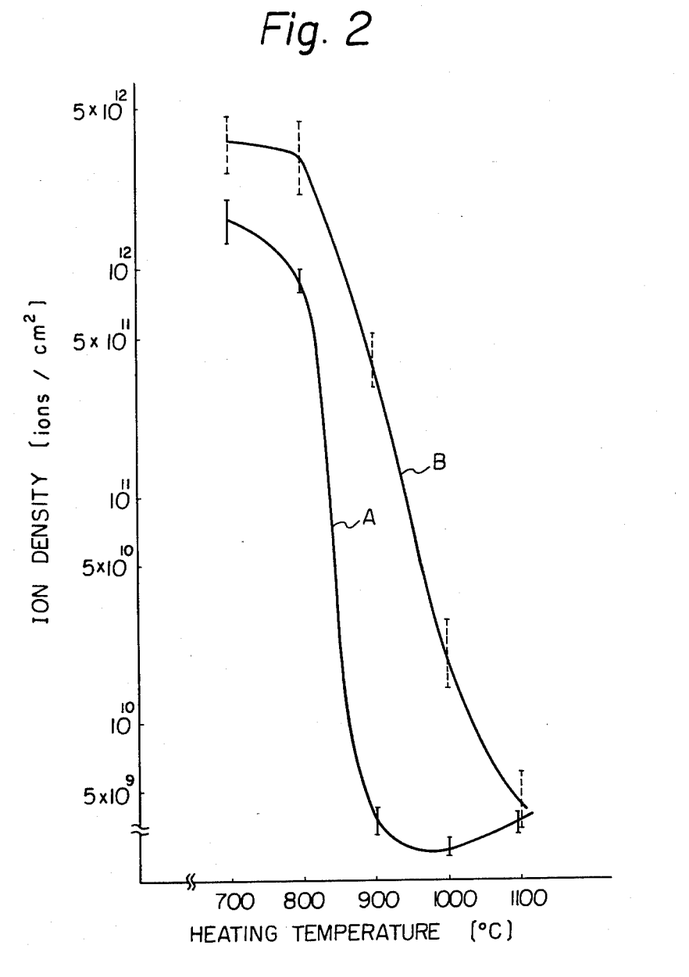
FIG. 2 is a graph showing the relationship between heating temperature and mobile cation density in insulating layers of MOS diodes which are provided with either a boron-containing tungsten electrode or a tungsten electrode not containing boron.

The following facts will be apparent from FIG. 2. The cation density in the silicon dioxide layer of the MOS diode according to the invention is considerably lower than and amounts to only from one tenth to one hundredth of that of the MOS diode according to the prior art, after both diodes are heated to temperatures of from 700° C. to 1100° C. Particularly at a temperature of from 900° C. to 1000° C., the mobile cation density is $5 \times 10^9$/cm$^2$; hence, the absolute number of the mobile ions is very low in the MOS diode, as indicated by the curve A.

EXAMPLE 2

An MOS (metal oxide semiconductor) diode according to the present invention comprised of a germanium-containing tungsten layer 14, a silicon dioxide layer 12, a silicon substrate 11 and an ohmic-contacting metal layer 15, as illustrated in FIG. 1(f), was produced in a manner similar to that described in Example 1.

When the sputtering treatment was performed, germanium was used instead of boron nitride. The shape and number of the germanium pieces used were the same as those of the boron nitride. After being subjected to chemical analysis, the tungsten layer 13 was revealed to contain germanium whose density was in the range of from $10^{19}/cm^3$ to $10^{20}/cm^3$ of the layer 13.

In order to compare the MOS diode according to the present invention with an MOS diode provided with a tungsten electrode not containing germanium according to the prior art, the latter MOS diodes was produced in the same manner as that described in Example 1.

The produced MOS diodes according to the present invention and the prior art were subjected to measurement of the number of cations, which were movable in the silicon dioxide layer, by the same method as that described in Example 1. The results of the measurement are illustrated in FIG. 3, wherein the curves A and B indicate the mobile cation density of the MOS diodes provided with the germanium-containing tungsten electrode and the tungsten electrode not containing germanium, respectively.

Figure 3:
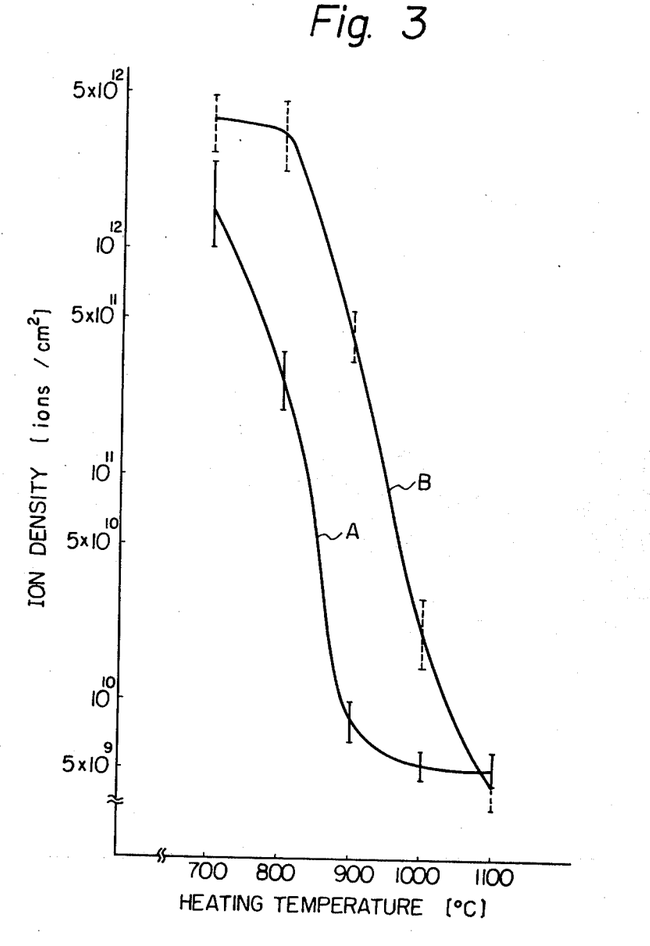
FIG. 3 is a graph showing the relationship between heating temperature and mobile cation density in insulating layers of MOS diodes which are provided with either a germanium-containing tungsten electrode or a tungsten electrode not containing germanium.

The following facts will be apparent from FIG. 3. The cation density in the silicon dioxide layer of the MOS diode according to the invention is considerably lower than and amounts to only from one tenth to one fiftieth of that of the MOS diode according to the prior art, after both diodes are heated to temperatures of from 700° C. to 1100° C. Particulary at a temperature of 1000° C., the mobile cation density is $5 \times 10^9/cm^2$; hence, the absolute number of the mobile ions is very low in the MOS diode, as indicated by the curve A.

EXAMPLE 3

An MOS (metal oxide semiconductor) diode according to the present invention comprised of a boron-containing molybdenum layer 14, a silicon dioxide layer 12, a silicon substrate 11 and an ohmic-contacting metal layer 15, as illustrated in FIG. 1(f), was produced in a manner similar to that described in Example 1.

When the sputtering treatment was performed, molybdenum was used instead of tungsten. After being subjected to chemical analysis, the layer 13 was revealed to contain boron whose density was in the range of from $10^{19}/cm^3$ to $10^{20}/cm^3$ of the layer 13.

In order to compare the MOS diode according to the present invention with an MOS diode provided with a molybdenum electrode not containing boron according to the prior art, the latter MOS diode was produced in almost the same manner as that described in Example 1. Namely, when a sputtering treatment for forming a molybdenum layer not containing boron was carried out as stated above, the above-mentioned boron nitride cubes were not used.

The produced MOS diodes according to the present invention and the prior art were subjected to measurement of the number of cations, which were movable in the silicon dioxide layer, by the same method as described in Example 1. The results of the measurement are illustrated in FIG. 4, wherein the curves A and B indicate the mobile cation density of the MOS diodes provided with the boron-containing molybdenum electrode and the molybdenum electrode not containing boron, respectively.

Figure 4:
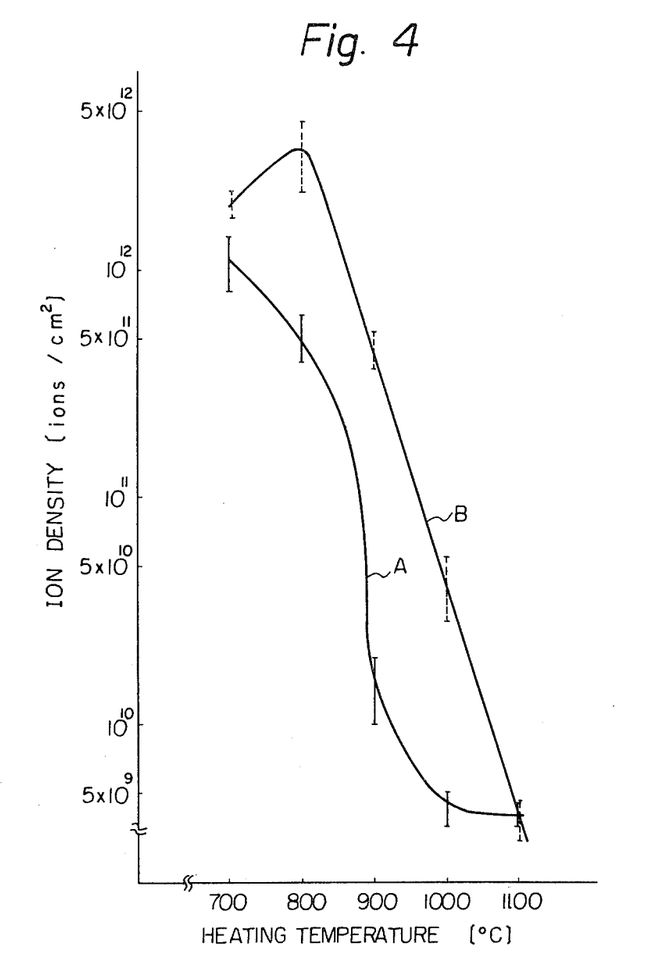
FIG. 4 is a graph showing the relationship between heating temperature and mobile cation density in insulating layers of MOS diodes which are provided with either a boron-containing molybdenum electrode or a molybdenum electrode not containing boron.

The following facts will be apparent from FIG. 4. The cation density in the silicon dioxide layer of the MOS diode according to the invention is considerably lower than and amounts to only from one tenth to one fiftieth of that of the MOS diode according to the prior art, after both diodes are heated to temperatures of from 700° C. to 1100° C. Particularly at a temperature of 1000° C., the mobile cation density is $4.5 \times 10^9/cm^2$; hence, the absolute number of the mobile ions is very low in the MOS diode, as indicated by the curve A.

EXAMPLE 4

An MOS (metal oxide semiconductor) diode according to the present invention comprised of a phosphorus-containing molybdenum layer 14, a silicon dioxide layer 12, a silicon substrate 11 and an ohmic-contacting metal layer 15, as illustrated in FIG. 1(f), was produced in a manner similar to that described in the Example 1.

When the sputtering treatment was performed, molybdenum and phosphorus nitride ($P_3N_5$) were used instead of tungsten and boron nitride, respectively. The shape and number of the phosphorus nitride pieces used were the same as those of the boron nitride. After being subjected to chemical analysis, the tungsten layer 13 was revealed to contain phosphorus whose density was in the range of from $10^{19}/cm^3$ $10^{20}/cm^3$ of the layer 13.

The heating treatment was performed in the same manner as that described in Example 2.

In order to compare the MOS diode according to the present invention with an MOS diode provided with a molybdenum electrode not containing phosphorus according to the prior art, the latter MOS diode was produced in the same manner as that described in Example 3.

The produced MOS diodes according to the present invention and the prior art were subjected to measurement of the number of cations, which were movable in the silicon dioxide layer, by the same method as that described in Example 1. The results of the measurement are illustrated in FIG. 5, wherein the curves A and B indicate the mobile cation density of the MOS diodes provided with the phosphorus-containing molybdenum electrode and the molybdenum electrode and the molybdenum electrode not containing boron, respectively.

Figure 5:
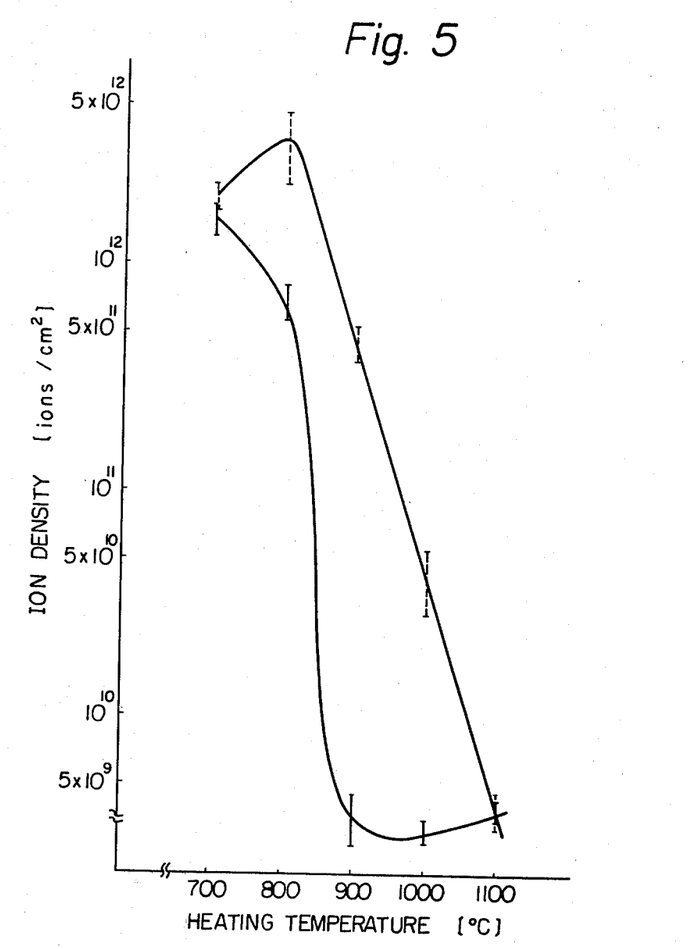
FIG. 5 is a graph showing the relationship between heating temperature and mobile cation density in an insulating layer of MOS diodes which are provided with either a phosphorous-containing molybdenum electrode or a molybdenum electrode not containing phosphorus.

The following facts will be apparent from FIG. 5. The cation density in the silicon dioxide layer of the MOS diode according to the invention is considerably lower than and amounts to only from one tenth to one hundredth of that of the MOS diode according to the prior art, after both diodes are heated to temperatures of from 700° C. to 1100° C. Particularly at a temperature of from 900° C. to 1000° C., the mobile cation density is in the range of from $10^{10}/cm^2$ to $3 \times 10^9/cm^2$; hence, the absolute number of the ions is very low in the MOS diode, as indicated by the curve A.

EXAMPLE 5

An MOS FET (metal oxide semiconductor field effect transistor) according to the present invention was produced in the following manner.

Figure 6:
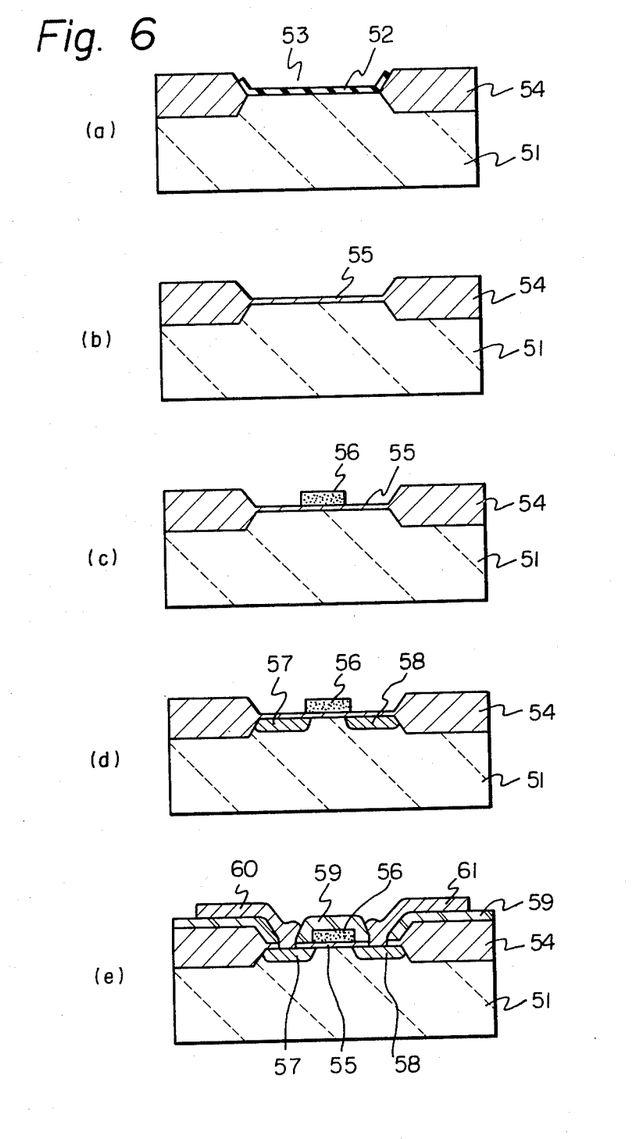
FIGS. 6(a) through 6(e) are schematic, cross-sectional views of a MOS FET in various stages of production.

A p-type silicon semiconductor substrate 51 (FIG. 6(a)), having a resistivity of 2 ohm cm, was used as the starting material. A silicon nitride layer 52 having a 1000 Å thickness was formed on the semiconductor substrate by a conventional chemical vapor deposition method and, then, was removed by means of a conventional photo-etching method, with the exception of the part which covered a region 53 of the semiconductor substrate, in which region 53 a semiconductor circuit element was to be formed. A silicon dioxide layer, i.e. a so called field oxide layer 54, was formed by a thermal oxidation method and by using the remaining part of the silicon nitride layer 52 as a mask against oxidation, as shown in FIG. 6(a).

The remaining part of the silicon nitride layer 52 was removed by etching to expose the region 53 of the semiconductor substrate. On the exposed region 53 a silicon dioxide layer, i.e. a so called gate insulating layer 55, having a 500 Å thickness, was formed by a thermal oxidation method, as shown in FIG. 6(b).

A boron-containing tungsten layer having a 3000 Å thickness was then deposited over the entire surfaces of the gate insulating layer 55 and the field oxide layer 54 by a sputtering method using targets of tungsten and boron nitride. The sputtering method will be described in detail hereinafter. The boron-containing tungsten layer was removed by a conventional photo-etching method to leave a part of the layer as the tungsten gate electrode 56 located on the central part of the gate insulating layer 55, as shown in FIG. 1(c). By an ion implantation method, a donor impurity ion, in this case, a phosphorus ion, was injected into the regions of the semiconductor substrate 51 which were not covered by the field oxide layer 54 and the gate electrode 56. Subsequently, the semiconductor substrate 51 was heated at 900° C., for 15 minutes, to activate the injected donor impurity. Thus, the n-type source and drain region 57 and 58 were formed, as shown in FIG. 1(d). During the heating, the boron contained in the tungsten gate electrode 54 was moved to the vicinity of the interface of the gate electrode 56 and the gate oxide layer 55 and trapped a number of cations, for example, sodium ions ($Na^+$), existing in the gate oxide layer 55.

A phosphosilicate glass (PSG) layer was formed on the entire surface of the filed oxide layer 54, the gate electrode 56 and the gate insulating layer 55 covering the source and drain regions 57 and 58. Parts of the phosphosilicate glass layer 59 and the gate insulating layer 55 which were located above and on the source and drain regions 57 and 58 were selectively removed by etching. A metal layer, in this case, an aluminum layer, was then formed by a vacuum evaporation method, and was removed by a photo-etching method to form a source electrode 60 and a drain electrode 61, in ohmic-contact with the surfaces of the source and drain regions 57 and 58 of the semiconductor substrate 51, as shown in FIG. 1(e).

Thus, in the produced MOS FET, the boron moved to the vicinity of the interface of the tungsten gate electrode and the gate insulating layer and reduced the mobile cations in the gate insulating layer remarkably, so that it was possible to prevent undesirable variation of a threshold voltage (Vth), in this case, a drop of the threshold voltage (Vth) of the MOS FET.

Figure 7:
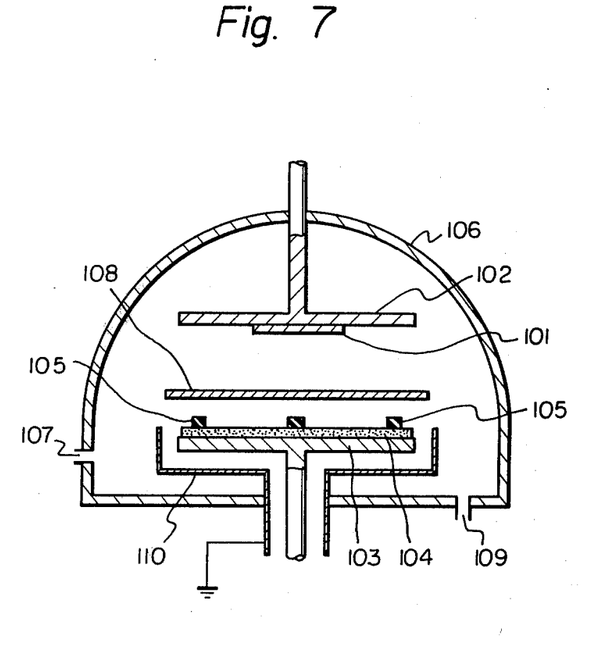
FIG. 7 is a schematic, cross-sectional view of a sputtering apparatus.

The above-mentioned sputtering was carried out in a sputtering apparatus, as shown in FIG. 7. The sputtering apparatus was comprised of an anode plate 102 for holding a semiconductor substrate 101 with an insulating layer, a cathode plate 103 for carrying targets 104 and 105 to be used, a bell-jar 106 provided with a gas-introducing opening 107, and an exhaust opening 109, a shutter 108 and a shielding plate 110. In this case, the semiconductor substrate to be held was the silicon semiconductor substrate 51 with the field oxide layer 54 and the gate insulating layer 55, as shown in FIG. 6(b). The targets 104 and 105 were a tungsten target having a diameter of 4 inches and eight pieces of boron nitride cubes, 5 mm in height, 5 mm in length and 5 mm in width. After the above-mentioned substrate and targets were placed a distance of approximately 4 cm apart, the bell-jar 106 was evacuated to a pressure of $1 \times 10^{-7}$ Torr. Subsequently, argon (Ar) gas was introduced into the bell-jar 106 to make the inside pressure thereof in the range of from $10^{-2}$ to $10^{-3}$ Torr. After a presputtering was carried out for 30 minutes with the shutter 108 closed, the shutter 108 was opened to carry out the sputtering for approximately 20 minutes, so that a 3000 Å thick, boron-containing tungsten layer was formed, as stated above. The electrical source of the presputtering and sputtering had a power of 250 W and a frequency of 13.56 MHz.

It will be obvious that the present invention is not restricted to the above-described embodiments and examples, and that many variations are possible for those skilled in the art without departing from the scope of this invention. For example, a metal layer according to the present invention can be formed on a silicon nitride layer, an alumina layer, a silicon dioxide-silicon nitride double layer, a silicon dioxide-alumina double layer or a silicon oxi-nitride layer. Namely, the invention can be utilized in MAS FET, MAOS FET, MNOS FET, MNS FET and so on. A semiconductor material other than silicon may be used.

What is claimed is:

1. A metal-insulator-semiconductor type semiconductor device comprising:
  a semiconductor substrate,
  an insulating layer convering a surface of said semiconductor substrate,
  a metal layer comprising at least one metal element selected from the group consisting of tungsten, molybdenum, titanium, tantalum, niobium, hafnium and iron formed on said insulating layer, and
  at least one cation-trapping element selected from the group consisting of boron, germanium, phosphorus, lead, tin, chromium and antimony comprised in said metal layer and in the upper part of said insulating layer.

2. A semiconductor device according to claim 1 or 13, the density of said cation-trapping element comprised in said metal layer being from $10^{15}$ to $10^{21}$ per cubic centimeter of said metal layer.

3. A semiconductor device according to claim 1, said device comprising a metal oxide semiconductor diode and said metal layer comprising an electrode of said device.

4. A semiconductor device according to claim 1, said device comprising a metal oxide semiconductor field effect transistor and said metal layer comprising at least a gate electrode of said device.

5. A metal-insulator-semiconductor type semiconductor device having a low density of contaminating impurity cations capable of producing instability in said device, said device comprising
  a semiconductor substrate, an insulating layer covering a surface of said semiconductor substrate, a metal layer on said insulating layer, and at least one cation-trapping element comprised in said metal layer and in the upper part of said insulating layer.

6. The device of claim 1 to 5, said contaminating impurity capable of producing instability comprising a minimum surface density in the range from $1 \times 10^9$ to $5 \times 10^9$ per square centimeter in said insulating layer.

* * * * *

UNITED STATES PATENT AND TRADEMARK OFFICE
CERTIFICATE OF CORRECTION

PATENT NO. : 4,270,136
DATED : May 26, 1981
INVENTOR(S) : Toyokura et al.

It is certified that error appears in the above—identified patent and that said Letters Patent is hereby corrected as shown below:

Front page, [73] Assignee, "Tokyo" should be -- Kawasaki-shi --.
    [56] References Cited, "Shinoda" should be --Shinoda et al.--.

Column 1, line 17, "example," should be --example--;
    line 25, "cially," should be --cially--;
    line 53, "substate" should be --substrate--.

Column 3, line 3, "especially," should be --especially--;
    line 9, "$10^{21}$" should not be in heavy type;
    line 38, "C." should be --C--;
    line 41, "preferably," should be --preferably--.

Column 4, line 14, delete ",";
    lines 52 and 53 (two occurrences), "C." should be --C--.

Column 5, line 6, "in" should be --in a--;
    line 19, "then," should be --then--;
    line 30, "an" should be --a--;
    line 45, "C." should be --C--.

Column 6, lines 11 (two occurrences), 44, 66 and 67 (two occurrences), "C." should be --C--;
    line 52, delete the second and third occurrences of ",".

// UNITED STATES PATENT AND TRADEMARK OFFICE
CERTIFICATE OF CORRECTION

PATENT NO. : 4,270,136
DATED : May 26, 1981
INVENTOR(S) : Toyokura et al.

It is certified that error appears in the above—identified patent and that said Letters Patent is hereby corrected as shown below:

Column 7, line 21, "diodes" should be --diode--;
        lines 40 and 41, "C." should be --C--;
        line 40, "Particulary" should be --Particularly--.
Column 8, lines 14, 15, 59 and 60 (two occurrences), "C."
    should be --C--;
        line 25, delete "the";
        line 33, after "$10^{19}/cm^3$" insert --to--;
        line 51, delete "and the molybdenum electrode";
        line 66, "An" should be --A--.
Column 9, line 2, "ohm cm," should be --ohm-cm,--;
        line 6, "and, then," should be --and then--;
        lines 11 and 18, "so called" should be --so-called--;
        line 22, "surfaces" should be --surface--;
        line 31, "case," should be --case--;
        line 36, "C." should be --C--;
    after "C" delete ",";
        line 37, "region" should be --regions--;
        line 40, "54" should be --56--;
        line 42, "example," should be --example--;
        line 45, "filed" should be --field--;
        line 51, "case," should be --case--;

UNITED STATES PATENT AND TRADEMARK OFFICE
CERTIFICATE OF CORRECTION

PATENT NO. : 4,270,136

DATED : May 26, 1981                    PAGE 3 OF 3

INVENTOR(S) : Toyokura et al.

It is certified that error appears in the above—identified patent and that said Letters Patent is hereby corrected as shown below:

line 54, delete ",";

line 63, "case," should be --case--.

Column 10, line 20, "$\overset{\circ}{A}$ thick" should be --$\overset{\circ}{A}$-thick--;

line 38, delete ":";

line 40, "convering" should be --covering--;

line 51, "or" should be --,--;

line 52, delete "13,".

Column 12, line 3, "to" should be --or--;

line 4, "impurity capable" should be --impurity being capable--.

Signed and Sealed this

Nineteenth Day of January 1982

[SEAL]

Attest:

GERALD J. MOSSINGHOFF

Attesting Officer      Commissioner of Patents and Trademarks